United States Patent [19]
Schicht

[11] Patent Number: 5,978,287
[45] Date of Patent: Nov. 2, 1999

[54] INPUT/OUTPUT DEVICE HAVING SHARED ACTIVE AREA

[75] Inventor: Steve Schicht, Boise, Id.

[73] Assignee: Micron Technology, Inc., Boise, Id.

[21] Appl. No.: 08/781,490

[22] Filed: Jan. 10, 1997

[51] Int. Cl.⁶ .................................................. H01L 17/02
[52] U.S. Cl. .................... 365/200; 365/205; 365/189.01; 365/190
[58] Field of Search ........................ 365/189.01, 23.01, 365/63, 205, 190

[56] References Cited

U.S. PATENT DOCUMENTS

| 5,196,233 | 3/1993 | Chan et al. . | |
|---|---|---|---|
| 5,309,047 | 5/1994 | Tiede et al. | 327/52 |
| 5,330,929 | 7/1994 | Friester et al. . | |
| 5,330,933 | 7/1994 | Chan et al. . | |
| 5,616,940 | 4/1997 | Kato et al. . | |
| 5,761,182 | 9/1997 | Yin | 365/189.05 |
| 5,825,687 | 10/1998 | Yin | 365/175 |
| 5,875,127 | 2/1999 | Yin | 365/185.2 |

FOREIGN PATENT DOCUMENTS

| 712 134 A2 | 5/1996 | European Pat. Off. . |
|---|---|---|
| 195 29 620 | 2/1996 | Germany . |

*Primary Examiner*—Viet Q. Nguyen
*Attorney, Agent, or Firm*—Thorp Reed & Armstrong, LLP

[57] ABSTRACT

An input/output device for use with an array of memory cells having a digitline and a complement of the digitline running through the array is fabricated on a substrate having active areas formed therein. Sensing transistors have terminals fabricated in the active areas which are responsive to the digitline and the complement of the digitline for sensing signals thereon in a read operation. Switching transistors have terminals fabricated in the active areas which are responsive to the sensing transistors for selectively conducting the signals sensed by the sensing transistors. Certain terminals of the sensing transistors and certain terminals of the switching transistors are fabricated in the same active area.

26 Claims, 4 Drawing Sheets

INPUT/OUTPUT DEVICE HAVING SHARED ACTIVE AREA

CROSS REFERENCE TO RELATED APPLICATION

This application is related to commonly assigned, co-pending U.S. patent application Ser. No. 08/690,124, filed Jul. 31, 1996 entitled Static Memory Cell.

BACKGROUND OF THE INVENTION

1. Field of the Invention

The present invention is directed generally to solid state memory circuits and, more particularly, to the input/output devices used in such circuits.

2. Description of the Background

Solid state memory circuits are comprised of a plurality of memory cells arranged in an array. The memory cells of one row are connected to a common digitline while each cell in the row is connected to a unique wordline. Conversely, the memory cells of one column are connected to a common wordline while each cell in the column is connected to a unique digitline. To address a cell for either a read or a write operation requires that both a digitline and a wordline be activated, with the cell at the intersection of that digitline and wordline being accessed.

To write information into the array or read information out of the array a number of peripheral devices must be used. Those devices generally include isolation transistors, equilibration and bias circuits, N-sense amplifiers, P-sense amplifiers, and switches for connecting selected digitlines of the array to input/output signal lines. Each of the aforementioned devices performs a specific function which is well known in the art. It is also well known that the aforementioned devices must be operated according to a precise timing sequence to ensure that the desired operation, a read or write operation, is properly performed.

The isolation transistors are placed between the digitlines of the memory array and the sense amplifier components. The isolation transistors can, if properly positioned, electrically isolate a portion of the array to thereby lessen the capacitance of the digitline being driven by the sense amplifiers. Reducing the capacitance speeds read-write times, reduces power consumption, and extends refresh for the isolated array. The isolation transistors also provide resistance between the sense amplifier and the digitlines. That resistance stabilizes the sense amplifiers and speeds up the sensing operation.

The equilibration and bias circuits ensure that digitlines, which form a column pair, are at the same voltage before the wordline is fired. Any offset voltage appearing between the pair directly reduces the effective signal produced during the access operation. The bias circuit operates in conjunction with the equilibration circuit to ensure that the digitline pair remains at the prescribed voltage for sensing. Normally, digitlines that are at Vcc and ground equilibrate to Vcc/2 volts. Bias circuits ensure that this occurs and also guarantee that the digitlines remain at Vcc/2, despite leakage paths that would otherwise discharge them.

The N-sense amplifiers and P-sense amplifiers work together to detect the access signal voltage and to help drive the digitlines to Vcc and ground.

As might be expected, the layout and fabrication of the isolation transistors, circuitry for digitline equilibration and bias, N and P sense amplifiers, and digitline to I/O signal line switches is a complicated process. All of the circuits that interface physically with the memory array are called pitch cells. The designation of pitch cell comes from the requirement that the physical layout of the pitch cell circuits be constrained by the digitline and wordline pitches of an array of m-bits. For example, the sense amplifiers for a specific digitline pair column are generally laid out within the space of four digitlines. The ratio of one sense amplifier for every four digitlines is commonly referred to as quarter pitch or four pitch. Because of the space requirements imposed on this collection of components, the design engineer is faced with the challenge of providing physically small components which fit within the allotted space which at the same time operate properly within the parameters established for such circuitry. Thus, the need exists for improvements in such access circuitry.

SUMMARY OF THE INVENTION

The present invention is directed to a peripheral device for use with an array of memory cells having a digitline and a complement to the digitline running through the array. The peripheral device is fabricated in a substrate having active areas formed therein. The peripheral device includes sensing transistors having sources and drains fabricated in certain active areas. The sensing transistors are responsive to the digitline and the complement of the digitline for sensing signals thereon. Switching transistors having sources and drains fabricated in certain of the same active areas as the sources and drains of the sensing transistors are also provided. The switching transistors are responsive to the sensing transistors for selectively conducting the signals sensed by the sensing transistors.

By fabricating each switching transistor such that one of its terminals is fabricated in the same active area as one of the terminals of one of the sensing transistors, the layout of the peripheral device is more compact. The switching transistors can be made larger thereby making write operations quicker. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
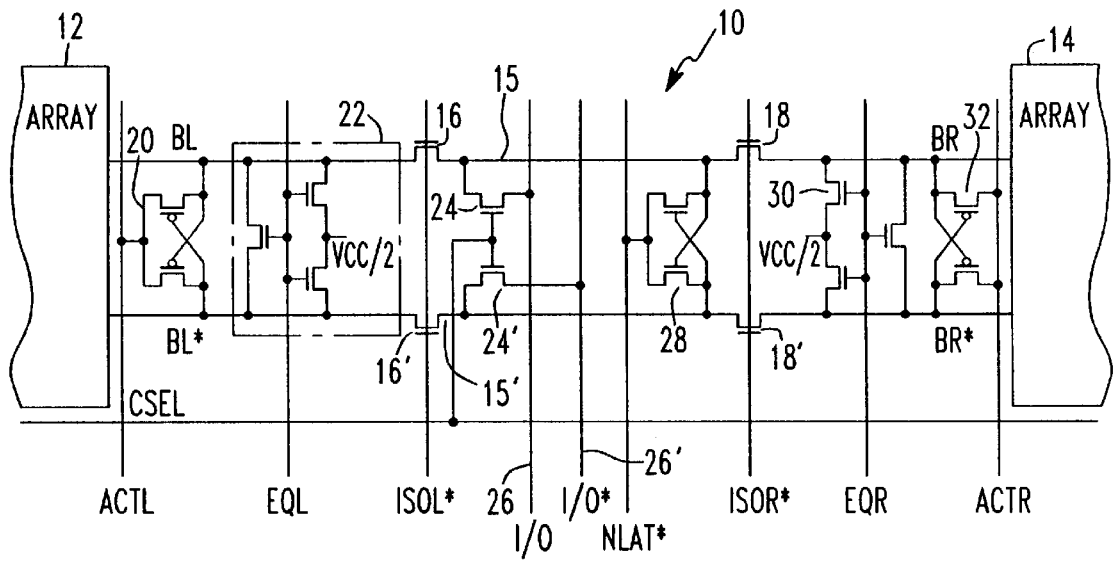
FIG. 1 is an electrical schematic of a standard sense amplifier block.

FIG. 1 is an electrical schematic of a standard sense amplifier block 10 positioned between a first (or left) array 12 and a second (or right) array 14. A digitline extends through and between the first array 12 and the second array 14. As is known in the art, the digitline is actually a pair of lines 15, 15', referred to as a column, where the line 15' carries the complement of the signal carried on the line 15. The digitline 15, 15' is divided into three portions: a left portion and a center portion are separated by a pair of isolation transistors 16, 16'; a right portion of the digitline is separated from the center portion of the digitline by a second pair of isolation transistors 18, 18'. Connected across the left portion of the digitline is a sense amplifier 20 responsive to the signal ACTL in a conventional manner. Also connected across the left portion of the digitline is an equalization circuit 22 responsive to a signal EQL in a known manner. The isolation transistors 16, 16' are responsive to an isolation signal ISOL* in a known manner.

The center portion of the digitline has connected thereacross a pair of input/output switches 24 and 24' which operate to connect the digitline 15 to an I/O line 26 while the transistor 24' operates to connect the complement of the digitline 15' to an I/0* line 26' which is the complement of the I/O line 26. Also connected across the digitline at the center portion thereof is a sense amplifier 28 responsive to the signal NLAT* in a known manner.

The isolation transistors 18 and 18' are responsive to a signal ISOR* in a known manner. The right portion of the digitline has connected thereacross another equilibration circuit 30 responsive to the signal EQR in a known manner and another sense amplifier 32 responsive to the signal ACTR also in a known manner.

Figure 2:
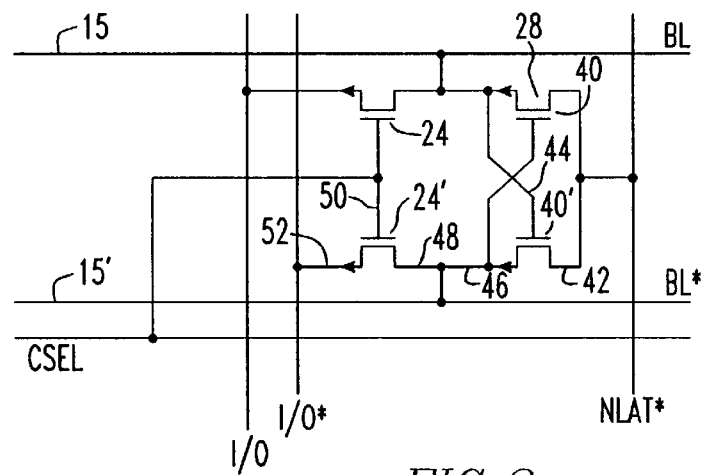
FIG. 2 illustrates a rearrangement of the sense amplifier and the switching transistors to physically place the devices sufficiently close together to enable those devices to share an active area in accordance with the teachings of the present invention.

FIG. 2 illustrates the sense amplifier 28 and the I/O switches 24, 24' rearranged so that the devices are physically closer together to enable those devices to be fabricated in a manner so as to share active areas in accordance with the teachings of the present invention. A transistor 40 of the sense amplifier 28 has a drain terminal connected to the NLAT* control signal, a source terminal connected to the digitline BL and a gate terminal connected to the complement of the digitline BL*. A transistor 40' has a drain terminal 42 connected to the control signal NLAT*, a gate terminal 44 connected to the digitline BL, and a source terminal 46 connected to the complement of the digitline BL*. The transistor 24 has a drain terminal connected to the digitline BL, a gate terminal connected to the control signal CSEL, and a source terminal connected to the input/output line I/O. The transistor 24' has a drain terminal 48 connected to the complement of the digitline BL*, gate terminal 50 connected to the control signal CSEL, and a source terminal 52 connected to the complement of the input/out line I/0*. According to the teachings of the present invention, the source terminal of the transistor 40 and the drain terminal of the transistor 24 are fabricated in the same active area. Similarly, the source terminal 46 of the transistor 40' and the drain terminal 48 of the transistor 24' are fabricated in the same active area. The shared active areas can be seen in the planar topological view of FIG. 3. The fabrication of the sense amp 28 and I/O switching transistors 24, 24' so as to have shared active areas is described in greater detail hereinbelow in conjunction with FIGS. 3 and 4.

Figure 3:
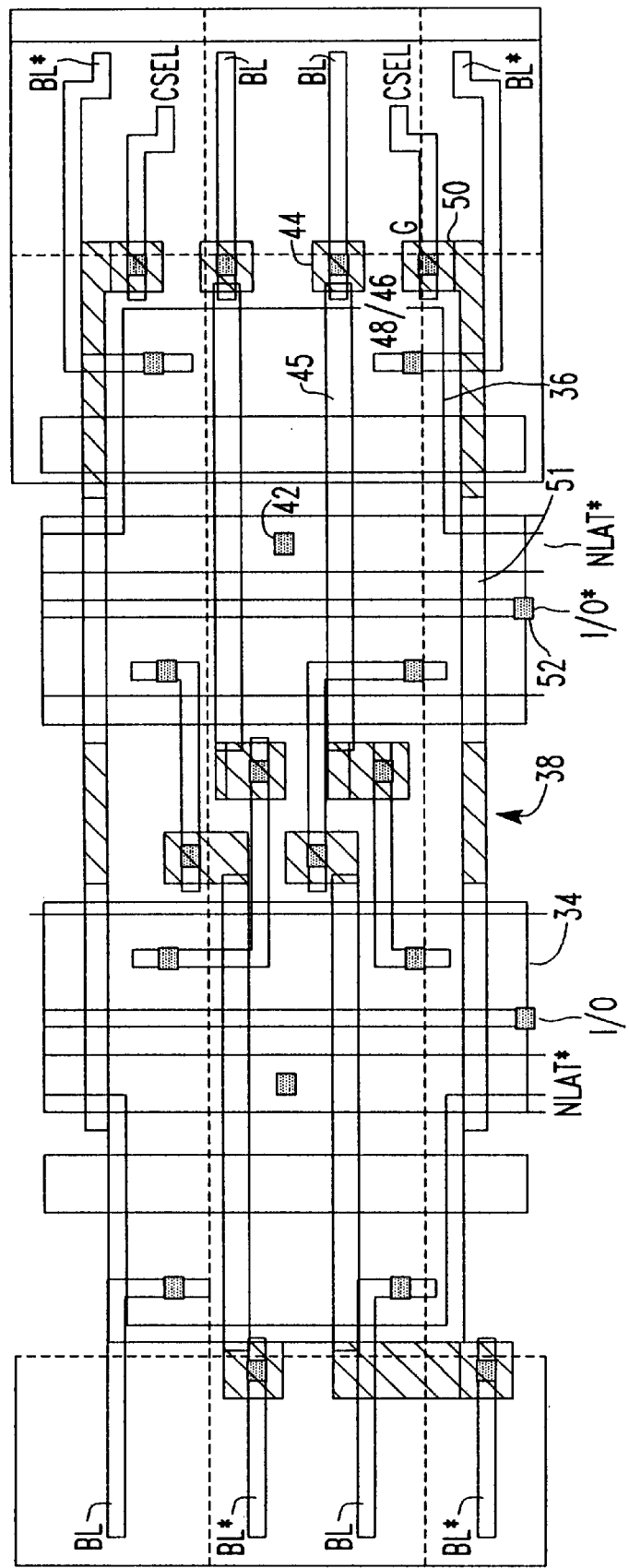
FIG. 3 is a top planar view of two sense amps and two pairs of I/O switches of the circuit of FIG. 2.

FIG. 3 is a top planar view showing two of the sense amplifiers 28 and two pairs of I/O switches 24, 24' of the circuit of FIG. 2. Two sense amps and two pairs of I/O switches are pictured in FIG. 3 to more easily show the regularity of the layout. Illustrated in FIG. 3 is a first active region 34 and a second active region 36 separated by a field region 38. The operation of the devices illustrated in FIG. 3 is more easily explained by reference to FIG. 4a.

Figure 4:
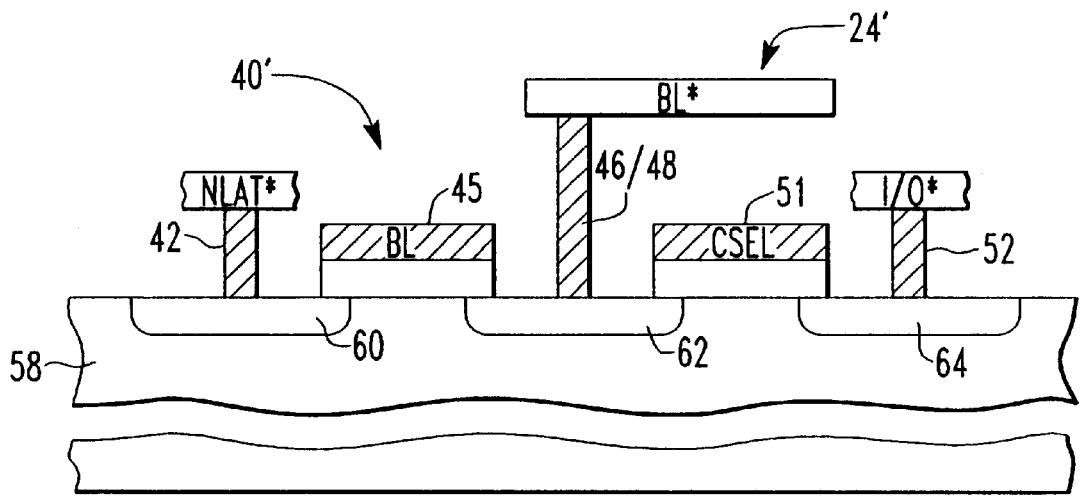
FIG. 4 is a cross-sectional view taken across certain points in FIG. 3.

FIG. 4 is a cross-sectional view taken across the terminals 42, 46/48, and 52 in FIG. 3. Terminal 42, which is the drain terminal of transistor 40', is connected to a conductor carrying the control signal NLAT*. The gate terminal 44 of the transistor 40' is shown in FIG. 3. However, the physical structure which forms the gate of the transistor is represented by reference numeral 45 in FIGS. 3 and 4 and should be distinguished from the gate terminal 44. The source terminal 46 of the transistor 40' is shown in FIG. 4 connected to the complement of the digitline BL*. The contact which forms the source terminal 46 of the transistor 40' is the same contact which forms the drain terminal 48 of the transistor 24' as clearly seen in FIGS. 3 and 4.

The transistor 24' is seen in FIG. 4 as having its drain terminal 48 connected to the compliment of the digitline BL*. The gate terminal 50, seen in FIG. 3, is connected to a gate region 51 which physically forms the gate of the transistor 24'. The source terminal 52 of the transistor 24' is connected to the complement of the input/output signal I/O*. Thus, it is seen in FIG. 4 that a substrate 58 carries an active area 60 and an active area 62 which, together with gate region 45, form the transistor 40' while the active area 62 and another active area 64, together with gate region 51, form the transistor 24'. In that manner, the active area 62 becomes a shared active area for transistors 40' and 24' such that the source terminal 46 of the transistor 40' and the drain terminal 48 of the transistor 24' are fabricated with a single shared contact in electrical contact with the shared active area 62.

The circuit laid out in FIG. 3 is symmetrical with respect to the layout of the transistors 24 and 40 of FIG. 2 such that the drain terminal of transistor 24 is fabricated in the same active area as the source terminal of the transistor 40. Otherwise, the layout of the components is conventional.

By fabricating each of the switching transistors so that one of its terminals is fabricated in the same active area as one of the terminals of one of the sense amplifier transistors, the layout of the peripheral device is more compact. The switching transistors can be made larger thereby making write operations quicker. Alternatively, if the size of the switching transistors is not increased, the possibility exists for a smaller layout area. The configuration of the present invention provides less active area resistance. The layout of the present invention also results in less leakage than separating the sense amplifiers with a large grounded gate structure. The layout of the present invention permits the use of various types of twists and is scalable for various fabrication processes.

Figure 5:
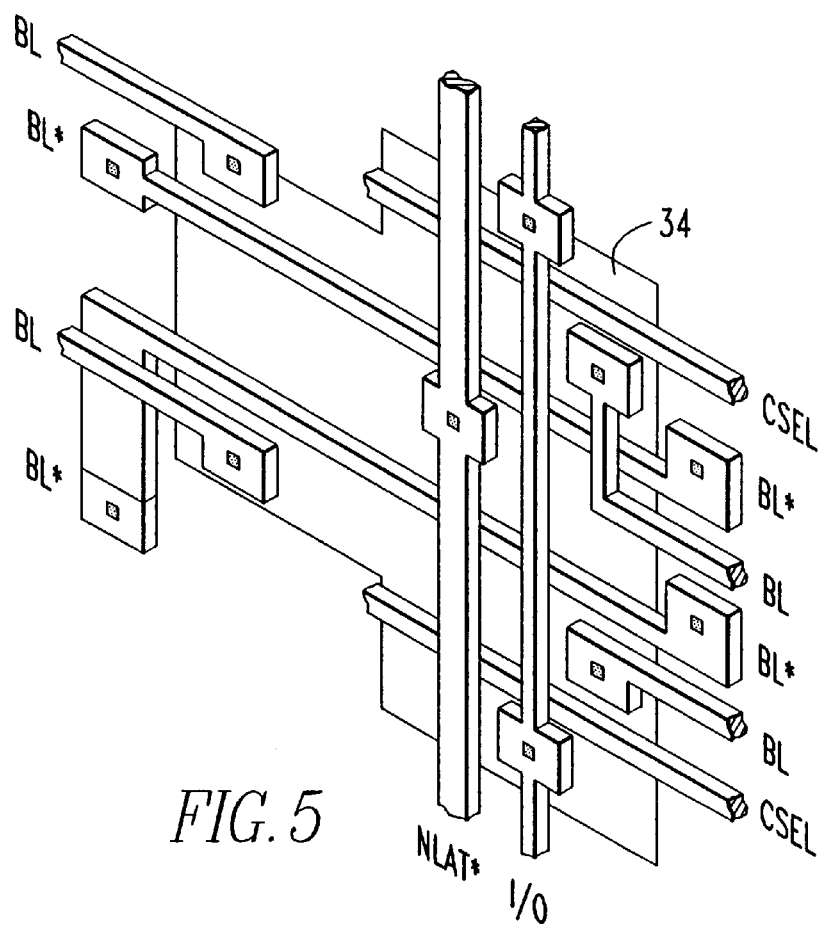
FIG. 5 is a three-dimensional view of a portion of the components shown in FIG. 3.

FIG. 5 is a three-dimensional view of a portion of the components shown in FIG. 3. FIG. 5 illustrates the depth dimension which is missing from FIG. 3. The running of the various conductors at various depths is conventional and does not form a feature of the present invention.

Those of ordinary skill in the art will recognize that although MOS transistors are illustrated, other types of transistors may be used and still obtain the advantages of the disclosed circuit architecture. Additionally, the transistors may be either N-type or P-type.

The present invention is also directed to a method of laying out and fabricating a circuit having a sense amplifier with integral output transistors. The method is performed on a substrate having active areas. The method is comprised of the steps of fabricating a plurality of transistors. The plurality of transistors includes a first transistor having a first terminal for connection to a control signal, a second terminal for connection to a digitline, and a third terminal for connection to the complement of the digitline, and a second transistor having a first terminal for connection to the control signal, a second terminal for connection to the complement of the digitline, and a third terminal for connection to the digitline. The plurality of transistors further includes a first output transistor having a first terminal for connection to the digitline, a second terminal for connection to an I/O line, and a control terminal for connection to a control signal, and a second output transistor having a first terminal for connection to the complement of the digitline, a second terminal for connection to a complement of the I/O line, and a control terminal for connection to the control signal. The transistors are laid out and fabricated such that the second terminal of the first transistor and the first terminal of the first output transistor are fabricated in the same active area formed in the substrate and the second terminal of the second transistor and the first terminal of the second output transistor are fabricated in the same active area in the substrate.

Figure 6:
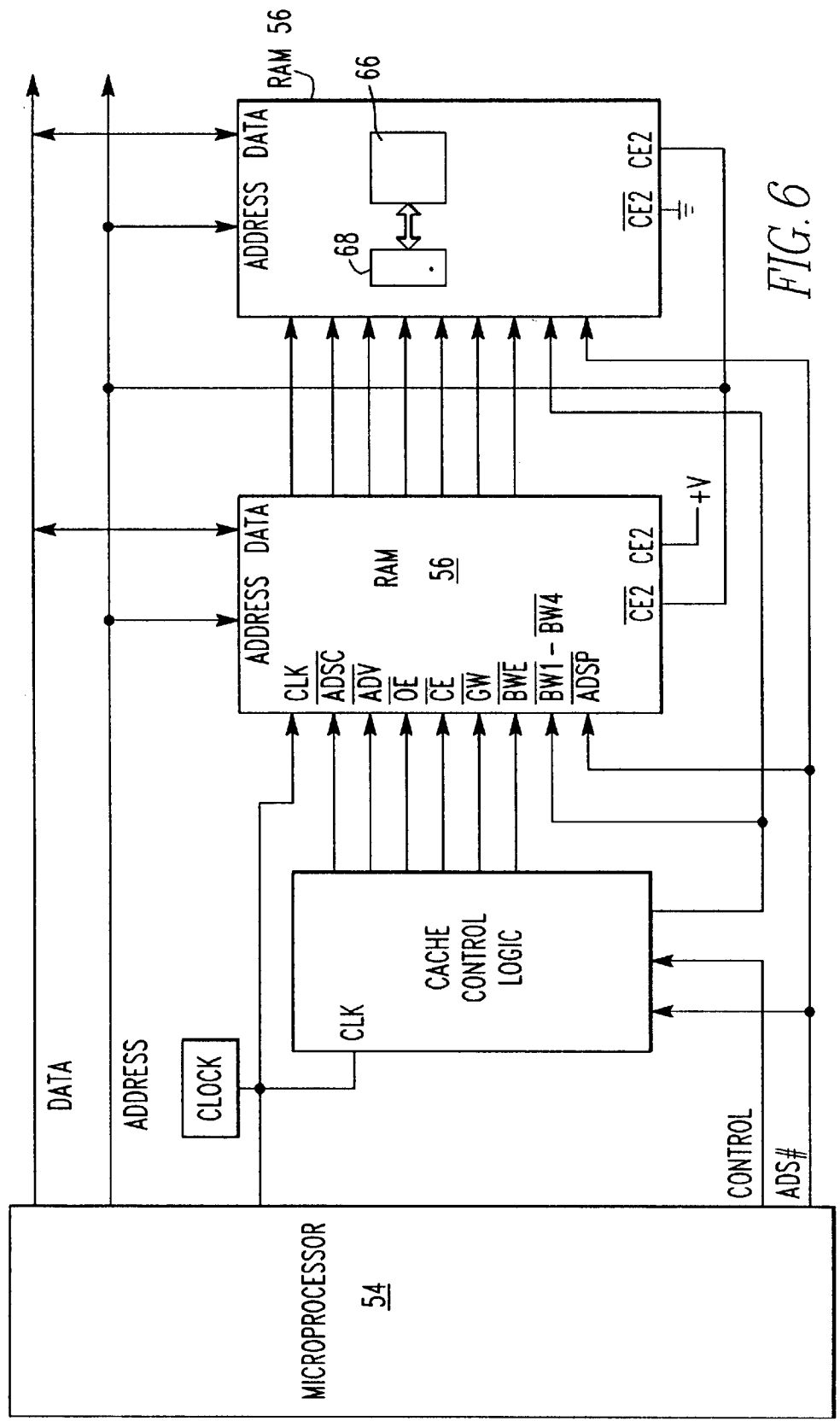
FIG. 6 is a block diagram of a system using a memory device employing a sense amplifier block constructed according to the teachings of the present invention.

Finally, FIG. 6 is a block diagram of a system using a memory device employing a sense amplifier block constructed according to the teachings of the present invention. The system is comprised of a microprocessor 54 which controls one or more memory devices 56. The memory devices 56 may include a memory array 66 and a support circuit 68 for reading information (data) into and out of the array 66. The support circuits 68 may each have enhanced operational characteristics such as improved write operations as a result of employing the teachings of the present invention.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A peripheral device for use with an array of memory cells having a digitline and a complement of the digitline running through the array, said peripheral device comprising:
    a substrate having active areas formed therein;
    sensing transistors having terminals fabricated in said active areas, said sensing transistors being responsive to the digitline and the complement of the digitline for sensing signals thereon during a read operation; and
    switching transistors having terminals fabricated in said active areas, said switching transistors being responsive to said sensing transistors for selectively conducting the signals sensed by said sensing transistors, and wherein certain of said terminals of said sensing transistors and said switching transistors are fabricated in the same active area.

2. The peripheral device of claim 1 additionally comprising an equilibration circuit for equilibrating the digitline and the complement of the digitline.

3. The peripheral device of claim 1 additionally comprising an isolation circuit for isolating a portion of said peripheral device from the array.

4. The peripheral device of claim 1 wherein said sensing transistors form an N-sense amplifier.

5. The peripheral device of claim 1 wherein said sensing transistors form a P-sense amplifier.

6. A memory device, comprising:
    a substrate having active areas;
    an array of memory cells fabricated on said substrate;
    a digitline and a complement of the digitline running through said array; and
    a circuit for writing information into and reading information out of said array, said circuit including:
        sensing transistors having gates, sources, and drains, said sources and drains being fabricated in said active areas, said sensing transistors being connected to said digitline and said complement of said digitline; and
        switching transistors having gates, sources, and drains, said sources and drains being fabricated in said active areas, said switching transistors being responsive to selectively conduct signals sensed by said sensing transistors, and wherein certain of said sources and drains of said sensing transistors and said switching transistors are fabricated in the same active area.

7. The memory device of claim 6 wherein said circuit additionally includes an equilibration circuit for equilibrating said digitline and said complement of said digitline.

8. The memory device of claim 6 wherein said circuit additionally includes an isolation circuit for isolating a portion of said circuit from said array.

9. The memory device of claim 6 wherein said sensing transistors form an N-sense amplifier.

10. The memory device of claim 6 wherein said sensing transistors form a P-sense amplifier.

11. A system, comprising:
    a microprocessor; and
    a memory device under the control of said microprocessor, said memory device comprising:
        a substrate having active areas;
        an array of memory cells fabricated on said substrate;
        a digitline and a complement of the digitline running through said array; and
        a circuit for writing information into and reading information out of said array, said circuit including sensing transistors having gates, sources, and drains, said sources and drains being fabricated in said active areas, said sensing transistors being connected to said digitline and said complement of said digitline, and switching transistors having gates, sources, and drains, said sources and drains being fabricated in said active areas, said switching transistors being responsive to selectively conduct signals sensed by said sensing transistors, and wherein certain of said sources and drains of said sensing transistors and said switching transistors are fabricated in the same active area.

12. A peripheral device for use with an array of memory cells having a digitline and a complement of the digitline running through the array, said peripheral device comprising:
    a substrate having active areas formed therein;
    sensing transistors having contacts fabricated in said active areas, said sensing transistors being responsive to the digitline and the complement of the digitline for sensing signals thereon; and
    switching transistors having certain contacts fabricated in said active areas and certain contacts shared with said sensing transistors, said switching transistors being responsive to said sensing transistors for selectively conducting the signals sensed by said sensing transistors.

13. The peripheral device of claim 12 additionally comprising an equilibration circuit for equilibrating the digitline and the complement of the digitline.

14. The peripheral device of claim 12 additionally comprising an isolation circuit for isolating a portion of said peripheral device from the array.

15. The peripheral device of claim 12 wherein said sensing transistors form an N-sense amplifier.

16. The peripheral device of claim 12 wherein said sensing transistors form a P-sense amplifier.

17. A peripheral device for use with an array of memory cells having a digitline and a complement of a digitline running through the array, said peripheral device comprising:

a semiconductor substrate;

a first transistor fabricated on said substrate and having a first terminal for connection to a control signal, a second terminal for connection to the digitline, and a third terminal for connection to the complement of the digitline;

a second transistor fabricated on said substrate and having a first terminal for connection to the control signal, a second terminal for connection to the complement of the digitline, and a third terminal for connection to the digitline;

a first output transistor fabricated on said substrate and having a first terminal for connection to the digitline, a second terminal for connection to an I/O line, and a control terminal for connection to a control signal; and a second output transistor fabricated on said substrate and having a first terminal for connection to the complement of the digitline, a second terminal for connection to a complement of the I/O line, and a control terminal for connection to the control signal, said second terminal of said first transistor and said first terminal of said first output transistor being located in the same active area formed in said substrate and said second terminal of said second transistor and said first terminal of said second output transistor being located in the same active area in said substrate.

18. The peripheral device of claim 17 wherein the control signal is an N type latch signal.

19. The peripheral device of claim 17 wherein the control signal is a P type latch signal.

20. The peripheral device of claim 17 wherein said first and second transistors and said first and second output transistors include MOS transistors.

21. A peripheral device for use with an array of memory cells having a digitline and a complement of a digitline running through the array, said peripheral device comprising:

a semiconductor substrate;

a first transistor fabricated on said substrate and having a first contact for connection to a control signal, a second contact for connection to the digitline, and a third contact for connection to the complement of the digitline;

a second transistor fabricated on said substrate and having a first contact for connection to the control signal, a second contact for connection to the complement of the digitline, and a third contact for connection to the digitline;

a first output transistor fabricated on said substrate, said first output transistor utilizing said second contact of said first transistor for connection to the digitline and having a second contact for connection to an I/O line, and a control contact for connection to a control signal; and a second output transistor fabricated on said substrate, said second output transistor utilizing said second contact of said second transistor for connection to the complement of the digitline and having a second contact for connection to a complement of the I/O line, and a control contact for connection to the control signal.

22. The peripheral device of claim 21 wherein the control signal is an N type latch signal.

23. The peripheral device of claim 21 wherein the control signal is a P type latch signal.

24. The peripheral device of claim 21 wherein said first and second transistors and said first and second output transistors include MOS transistors.

25. The peripheral device of claim 21 wherein the sharing of contacts results in a more compact device.

26. The peripheral device of claim 21 wherein the sharing of contacts results in output transistors having a larger active area.

* * * * *